United States Patent [19]
Mirza et al.

[11] Patent Number: 5,247,645
[45] Date of Patent: Sep. 21, 1993

[54] DYNAMIC MEMORY MAPPER WHICH SUPPORTS INTERLEAVING ACROSS $2^N+1$, $2^N$, AND $2^N-1$ NUMBER OF BANKS FOR REDUCING CONTENTION DURING NONUNIT STRIDE ACCESSES

[75] Inventors: Jamshed H. Mirza, Woodstock, N.Y.; Steven W. White, Austin, Tex.

[73] Assignee: International Business Machines Corporation, Armonk, N.Y.

[21] Appl. No.: 668,007

[22] Filed: Mar. 12, 1991

[51] Int. Cl.$^5$ ............... G06F 12/06; G06F 13/00
[52] U.S. Cl. ............... 395/425; 395/400; 364/DIG. 1; 364/229; 364/254.4; 364/265; 364/268.3; 364/944.92; 364/957.2
[58] Field of Search ... 364/200 MS File, 900 MS File, 364/254.4; 395/400, 425

[56] References Cited

U.S. PATENT DOCUMENTS

| | | | |
|---|---|---|---|
| 3,737,870 | 6/1973 | Carter et al. | 364/200 |
| 3,820,079 | 6/1974 | Bergh et al. | 395/325 |
| 4,051,551 | 9/1977 | Lawrie et al. | 364/200 |
| 4,280,176 | 7/1981 | Tan | 395/425 |
| 4,400,768 | 8/1983 | Tomlinson | 364/200 |
| 4,400,794 | 8/1983 | Koos | 364/900 |
| 4,507,730 | 3/1985 | Johnson et al. | 354/200 |
| 4,740,916 | 8/1988 | Martin | 395/425 |

FOREIGN PATENT DOCUMENTS

90/04576  5/1990  World Int. Prop. O. .

OTHER PUBLICATIONS

Chen et al., "Analysis of Vector Access Performance on Skewed Interleaved Memory", Computer Architecture Conference Proceedings, Jun. 1989, pp. 387–394.
Cheung et al., "Design and Analysis of a Gracefully Degrading Interleaved Memory System", IEEE Transactions on Computers, Jan. 1990, pp. 63–71.
Mirza et al., "Address Mapping for a Memory System with a Prime Number of Banks", IBM Technical Disclosure Bulletin, vol. 27, No. 11 Apr. 1985, pp. 6369–6372.
Budnik et al., "The Organization and Use of Parallel Memories", IEEE Transactions on Computers, Dec. 1971, pp. 1566–1569.

*Primary Examiner*—Joseph L. Dixon
*Assistant Examiner*—Frank J. Asta
*Attorney, Agent, or Firm*—Floyd A. Gonzalez

[57] ABSTRACT

A memory system for a high performance data processing system comprises a plurality of memory modules. In the preferred embodiment, there are $2^N+1$ memory modules. In a specific example, there are 65 such modules. When all 65 modules are enabled, a real-to-physical translation unit generates logical module addresses from 0 to 64 using modulo 65 calculations. Once a module failure is detected, the translation unit maps the real addresses to logical module addresses from 0 to 63 by performing modulo 64 calculations. The contiguous set of logical module addresses are then mapped to a set of physical module addresses which do not include the failed module.

10 Claims, 7 Drawing Sheets

DYNAMIC MEMORY MAPPER WHICH SUPPORTS INTERLEAVING ACROSS $2^N+1$, $2^N$, AND $2^N-1$ NUMBER OF BANKS FOR REDUCING CONTENTION DURING NONUNIT STRIDE ACCESSES

BACKGROUND OF THE INVENTION

1. Field of the Invention

The present invention generally relates to memory architectures for high performance data processing systems and, more particularly, to a real-to-physical address mechanism which allows a dynamically-specified number basic storage modules (BSMs) to be a value other than a power of two, allowing higher performance for non-unit stride memory accesses, and allowing a failing BSM to be removed with only its corresponding reduction in memory space.

2. Description of the Prior Art

Due to the disparity between memory and processor speeds in a high performance data processing system, a high degree of interleaving becomes a requirement. For example, in a uni-ported vector design, a common design point is M*P interleaves, where P is the number of processors and M is the ratio of memory cycle to processor cycle. Multiple ports or pipes in a vector design increase the interleave requirements. In designs such as the Cray Y-MP computer, the number of banks is large enough that hardware constraints require a banking hierarchy. In IBM terminology, the highest level is comprised of Basic Storage Modules (BSMs). The effective number of BSMs limits the number of storage accesses allowed per processor cycle. The degree of banking within a BSM is determined by the ratio of memory to processor cycle times. As one example, there might be 64 BSMs with 128 banks each.

In most high-performance designs, the address bits are divided into the following fields:

| chip select and address within chip | bank select | BSM select | byte index |
|---|---|---|---|
| | | | |

The first three of these fields select a memory word, while the lowest-order bits select bytes within the word. In an effort to achieve a uniform distribution of storage requests across BSM units, the BSM selection field is usually the lowest-order bits which select words. The bank selection bits are the next higher order set of bits. The remaining bits select locations within a chip and chips within a bank. For purposes of illustration, a base memory design which uses four-byte words and 64 BSMs is assumed.

Since the BSM select bits are low-order word-select bits, one failing BSM affects one word in every block of 64 words. When a BSM fails, to eliminate the gaps caused by the failing BSM, the standard approach is to use one less bit in the BSM selection field, forcing all storage requests to the "good half" of memory. This results in reducing the number of BSMs by a factor of two which, in turn, halves the available memory. An alternative to halving the number of BSMs is to provide a spare BSM which can be used to replace a failed BSM; however, the cost of an extra idle BSM is often considered unattractive.

Additionally, some high-performance memory designs have attempted to avoid the degradation which occurs when memory is referenced with a stride (or step size) which results in the set of references being confined to a small set of the memory modules. P. Budnik and D. Kuck describe the stride problem and the benefits of having a memory system in which the number of banks is not a power of two in "The organization and use of parallel memories", *IEEE Trans. on Computers*, vol. C-20, Dec. 1971, pp. 1566-1569 U.S. Pat. No. 4,051,551 to Duncan H. Lawrie et al. illustrates one approach to such a memory system with seventeen modules.

SUMMARY OF THE INVENTION

It is therefore an object of the present invention to provide a real-to-physical address mechanism which allows the (dynamically-specified) number of BSMs to be a value other than a power of two allowing a failed BSM to be removed with only its corresponding reduction in memory space.

It is a further object of the invention to provide a real-to-physical address translation mechanism which performs mapping of BSMs so that no gaps in memory appear in spite of failed BSM(s).

It is yet another object of the invention to provide an address translation mechanism that accounts for a failed BSM yet diminishes stride-N conflicts.

According to the invention, there is provided a memory system which consists of $2^N+1$ BSMs. As an illustration, the design might include 65 BSMs. The real-to-physical translation unit generates logical BSM addresses from 0 to 64 using modulo 65 calculations. Once a BSM failure is detected, the translation unit maps the real addresses to logical BSM addresses from 0 to 63 by performing modulo 64 calculations. The contiguous set of logical BSM addresses are then mapped to a set of physical BSM addresses which do not include the failed BSM. If a second BSM fails, the number of logical BSMs can be reduced to 63. Addresses within a BSM are the integer value of the word address divided by the number of logical BSMs. As a logical BSM is removed, there is only a small reduction in memory capacity.

The invention employs a technique for performing modulo$_N$ calculations by simple add operations which we described in "Address Mapping for a Memory System with a Prime Number of Banks", *IBM Tech. Disclosure Bull.*, vol. 27, no. 11, April 1985, pp. 6369-6372. This concept is used to generate logical BSM addresses. The subject invention uses a new mechanism for determining the address within a BSM. Also, the invention provides a new method for translating logical BSM addresses to physical BSM addresses while avoiding one or more failed BSM units.

In most programs, stride-N accesses tend to have stride values which are "round" numbers (e.g., 40, 200 or 100*100); therefore, typical stride values have factors which are powers of two. In memory designs in which the number of BSMs is a power of two, performance is often degraded by such stride-N accesses. The invention solves the stride-N conflicts problem since the number of BSMs, under normal circumstances, is not a power of two. For example, the number of BSMs may be 65 or 63, which have factors such as 5, 7, 9 and 13, and these factors are not common stride values.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
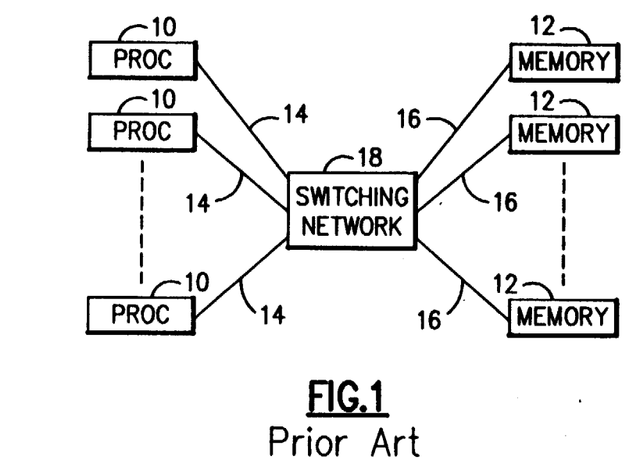
FIG. 1 is a generalized block diagram showing a typical high-performance data processing system.

Referring now to the drawings, and more particularly to FIG. 1, there is shown a high-performance data processing system comprising a plurality of central processing units (CPUs) 10, each operating independently and in parallel with each other. Each of the CPUs 10 occasionally requires access to one of the several memory devices 12 (i.e., BSMs). Each CPU 10 has a path 14, and each memory device has a path 16. A CPU 10 requiring access to a memory device 12 has its path 14 connected to the path 16 of the required memory device 12 by means of a switching network 18.

An address can be partitioned into a BSM number and an address within a BSM. This BSM number is used by the switching network 18 to determine the proper connection. The "address within a BSM" is passed through the switching network without modification. In current systems, the BSM value is simply a group of address bits. The remaining bits are the "address within a BSM". This is equivalent to a greatly modified modulo $2^N$ calculation.

In the preferred embodiment of the present invention, the addresses are mapped to BSM values using modulo circuitry, where the modulo value is 65, 64 or 63. The unmodified byte-index bits are passed through the translation unit. The word select bits are mapped to a logical BSM select and an address within the BSM as:

BSM select = (word select) modulo B address within BSM = floor (word select/B) || byte index bits where B is the number of currently available BSMs. This is a unique one-to-one mapping of addresses to pairs of "BSM select" and "address within BSM" values for a given value of B.

Figure 2:
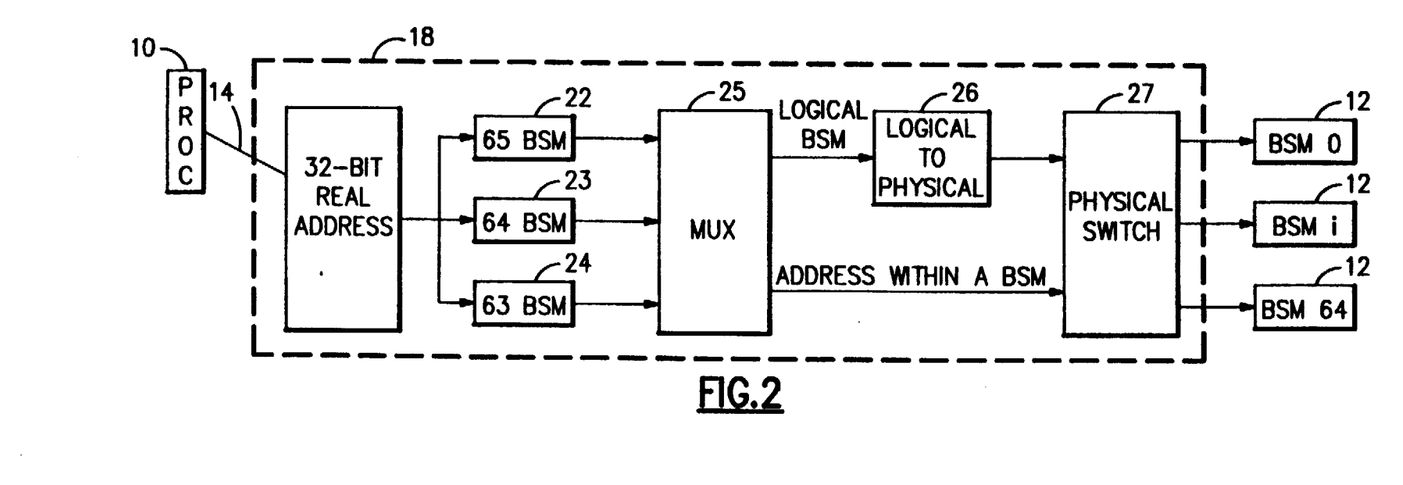
FIG. 2 is a generalized block diagram showing an overview of the real-to-physical translation according to the invention.

For purposes of illustration, the real-to-logical translation unit described consists of three independent circuits, one each for the cases where there are 65, 64 or 63 available BSMs. This arrangement is shown in FIG. 2, to which reference is now made. The 32-bit real address 21 is supplied to each of translation circuits 22, 23 and 24. The multiplexor 25 selects the output of one of the translation circuits, based on the number of currently active BSMs, and outputs the logical BSM address and an address within the BSM. The final mapping between a contiguous assignment of logical BSMs to a possibly disjoint assignment of physical BSMs is performed on the BSM select field. The logical BSM address is converted to a physical address by mapping circuit 26, and this physical address together with the address within the BSM is supplied to physical switch 27. Switch 27 makes the connection to the addressed BSM 12 and routes the address within the BSM to the connected BSM.

The translation hardware for the three cases are described below:

65 BSMs

The real-to-physical translation is performed in two steps:
generation of the BSM number
determination of the address within the BSM.

Figure 4:
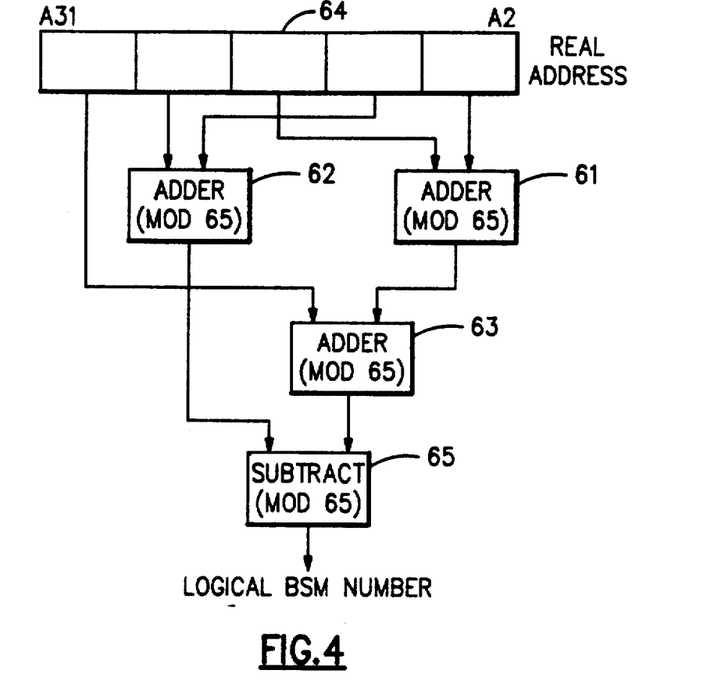
FIG. 4 is a detailed block diagram showing a modulo 65 circuit for calculating a BSM number when all 65 BSMs are active.

The circuit which generates the logical BSM number shown in FIG. 4 is based on our prior disclosure in *IBM Tech. Disclosure Bull.*, vol. 27, no. 11, cited above; however, the path delay is even shorter in this case since the address bits are grouped into 6-bit fields, resulting in a reduction in the number of adders in the tree.

Figure 3:
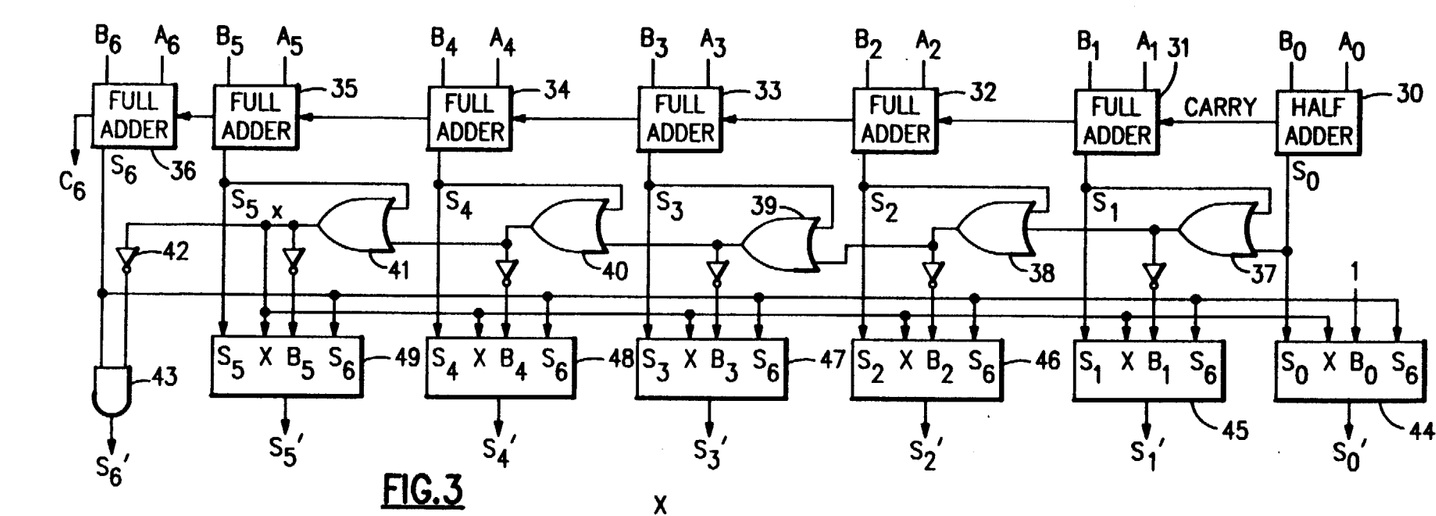
FIG. 3 is a detailed logic diagram showing improved "post-add" modulo 65 circuitry.

In FIG. 3, the sum bit $S_0$ is generated by half adder 30, and the sum bits $S_1$ through $S_6$ are generated by full adders 31 to 36. The sum bits $S_1$ to $S_5$ are input to cascaded OR gates 37 to 41 with the sum bit $S_0$ also being input to OR gate 37. The output of OR gate 41 is denoted as "X" and inverted by invertor 42 as the gate input to AND gate 43. The sum bit $S_6$ is input to AND gate 43 so that $S_6'$ is reset if $S_6$ is TRUE and X is TRUE. X is TRUE if any adder output $S_0$ through $S_6$ is TRUE. The sum bits $S_0'$ through $S_5'$ are generated by "post-add" circuits 44 through 49. Each of these receive as inputs $B_1$, $S_1$, "X", and $S_6$. Note, however, that $B_0$ is held to logical "1" in circuit 44.

The "post-add" circuits 44 through 49 perform the following logical operation:

$$S_1' = S_1 \cdot \overline{X} + S_1 \cdot \overline{B_1} + S_1 \cdot \overline{S_6} + \overline{S_1} \cdot X \cdot B_1 \cdot S_6 + C_6$$

Figure 3A:
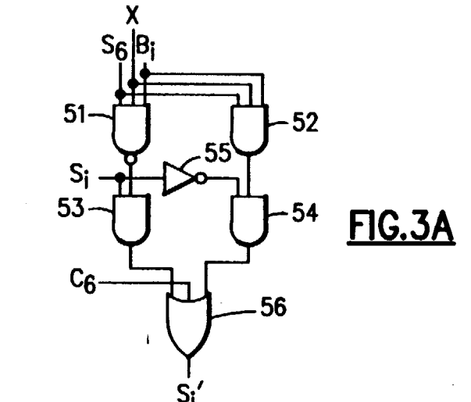
FIG. 3A is a logic diagram of a representative "post-add" circuit.

This operation is performed by the circuit shown in FIG. 3A. The input to this circuit is composed of a NAND gate 51 and an AND gate 52 to each of which are input $S_6$, X and $B_1$. The output of NAND gate 51 is supplied to AND gate 53 which is gated by $S_1$, while the output of AND gate 52 is supplied to AND gate 54 which is gated by $\overline{S_1}$ from invertor 55. The outputs of AND gates 53 and 54 and $C_6$ from full adder 36 are input to OR gate 56 which outputs $S_1'$. It might be noted that since X is the complement of $B_5$, $S_5' = S_5 + C_6$.

In the "post-add" circuit shown in FIG. 3A, the path delay is reduced as compared to our previous disclosure. In our previous disclosure, the circuit tested for the sum being greater than $2^N$ and then conditionally added "$-(2^N+1)$". The faster mechanism, shown in FIGS. 3 and 3A, according to one aspect of the present invention is to use the test result to conditionally reset the high-order bit (i.e., $2^N$) and perform a conditional decrement on the remaining bits. In each modulo circuit, borrow prediction, similar to carry look-ahead, is done in parallel with the test for "greater than $2^N$". For each sum output, the corresponding (conditional) borrow ($B_1$) is TRUE if all lower order sum bits are zero. Line "X" is true if any sum bit $S_0$ through $S_5$ is true; therefore, the 7-bit sum ($S_0$-$S_6$) is greater than 64 if sum bit $S_6$ and "X" are both true. If the sum is less than 128 (i.e., $C_6 = 0$) and borrow bit $B_1$ or "X" or sum bit $S_6$ are false, then the number is 64 or less or there is not a borrow from the lower-order bits, and the sum bit $S_1$ is passed through unmodified to become $S_1'$. Otherwise, if borrow bit $B_1$ and "X" and sum bit $S_6$ are all true and $C_6 = 0$, then the sum is greater than 64 (and not 128); and there is a borrow from the next lower order adder stage; therefore, the sum bit $S_1'$ is obtained as the complement of $S_1$. It might be noted that on a bit for bit basis, to subtract one (as in the case of a borrow) complements the bit. Since the maximum value of either input to the adder is 64, if $C_6$ is true, then the sum must be 128 and $S_0$ through $S_6$ are known to be false. The correct (modulo 65) result should be 63 which is obtained by inputting $C_6$ into OR gates 56 for bits $S_0'$ through $S_5'$. Due to the cascaded nature of the adders, and the fact that line "X" and all of the borrow bits $B_1$ do not depend on the highest-order stage of the adders, "X" and all borrow bits $B_1$ should be available when sum bit $S_6$ becomes available. Therefore, the add/modulo operation is one or, perhaps, two gate delays longer than a normal add.

FIG. 4 shows the modulo 65 circuit for calculating the BSM address as comprising three modulo 65 adders 61, 62 and 63, each receiving 6-bit segments of the real address in register 64. More specifically, the adder 61 receives address bits $A_2$ to $A_7$ and $A_{14}$ to $A_{19}$; the adder 62 receives address bits $A_8$ to $A_{13}$ and $A_{20}$ to $A_{25}$; and the adder 63 receives address bits $A_{26}$ to $A_{31}$ and the output of the adder 61. The outputs of adders 62 and 63 are supplied to modulo 65 subtractor 65 which produces the logical BSM number. The modulo 65 operation for adder 63 can be further simplified by letting the (conditional) decrement be handled as borrow in the subtraction operation performed by subtractor 65.

Figure 5:
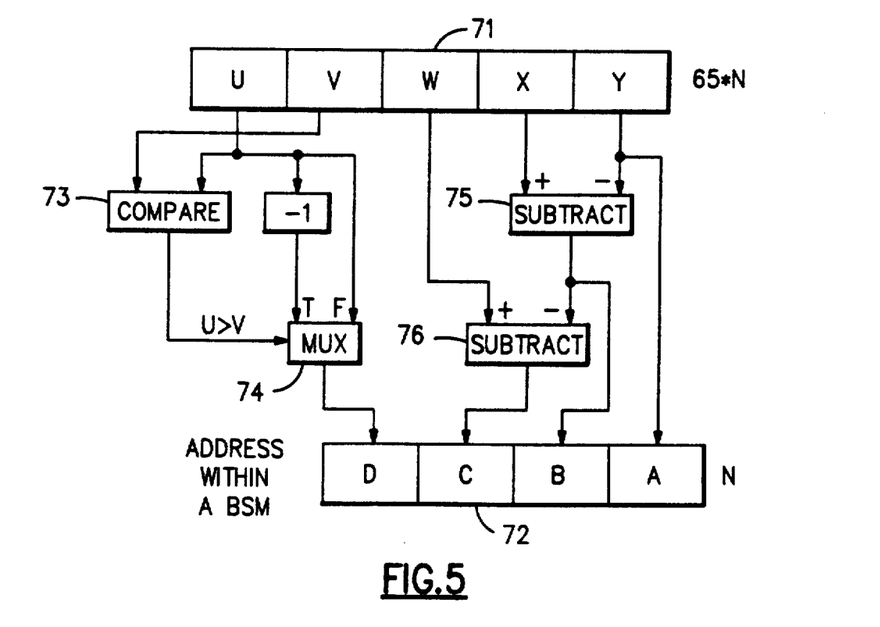
FIG. 5 is a detailed block diagram showing a circuit for calculating an address within a BSM when all 65 BSMs are active.

In our previous disclosure, we did not discuss any method of determining an address within a BSM. According to the present invention, the logical BSM number is subtracted from the original word address. The result is a 30-bit value used to generate the address within a BSM. As shown in FIG. 5, the 30-bit value, a multiple of 65, is partitioned in register 71 into five 6-bit fields, U, V, W, X, and Y, where U is the high-order field. The expected address within a BSM is partitioned in register 72 into four 6-bit fields, A, B, C, and D, where D is the high-order field. The values of U and V are compared in comparator 73 which provides an output to the select input of multiplexor 74. If $U > V$, the D field receives the value of $U - 1$. Otherwise, the D field receives the value of U. The value of Y is passed through to the A field unmodified. The value of Y is also subtracted in subtractor 75 from X to generate the B field. The potential borrow for this subtraction and B are subtracted from W in subtractor 76 in the calculation of the C field, i.e., C = W-B-borrow.

Appendix one illustrates the theory behind the generation of the address within a BSM when 65 BSMs are active.

64 BSMs

Figure 6:
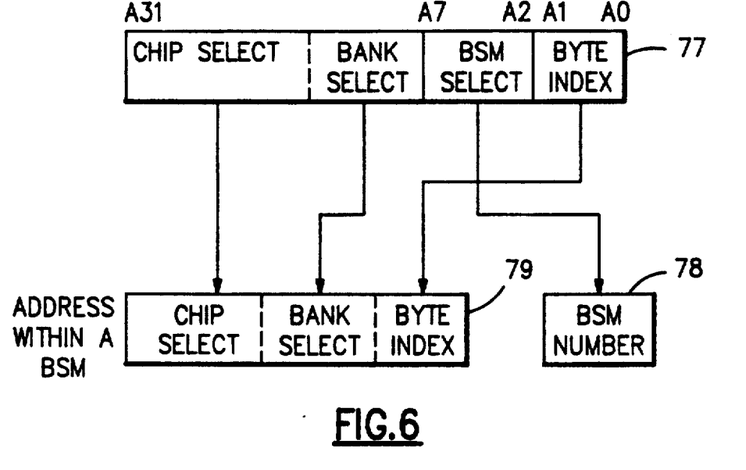
FIG. 6 is a detailed block diagram showing how to form a BSM number and an address within a BSM when 64 BSMs are active.

FIG. 6 shows that since 64 is a power of two, we take advantage of the same simplified hardware that current systems use. More specifically, the low-order bits $A_2$ to $A_7$ of the address in register 77 become the BSM number in register 78, and the remaining bits are stored in register 79 form the address within a bank.

63 BSMs

Figure 7:
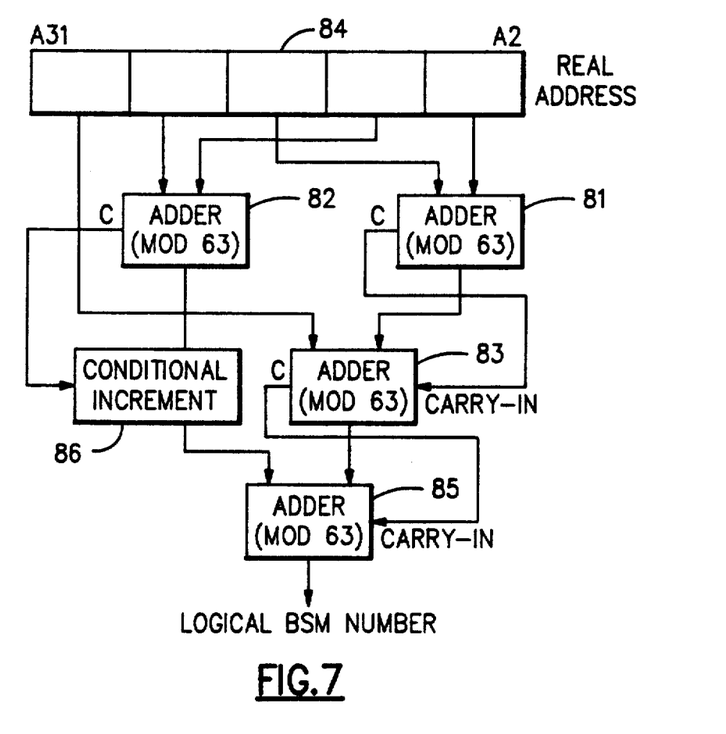
FIG. 7 is a detailed block diagram showing a modulo 63 circuit for calculating a BSM number when only 63 BSMs are active.

As shown in our previous disclosure, *IBM Tech. Disclosure Bull.*, vol. 27, no. 11, cited above, the circuitry for modulo 63 calculation shown in FIG. 7 is extremely similar to that of the modulo 65 shown in FIG. 4. In FIG. 7, the modulo 63 circuit comprises three modulo 63 adders 81, 82 and 83, each receiving 6-bit segments of the real address in register 84. More specifically, the adder 81 receives address bits $A_2$ to $A_7$ and $A_{14}$ to $A_{19}$; the adder 82 receives address bits $A_8$ to $A_{13}$ and $A_{20}$ to $A_{25}$; and the adder 83 receives address bits $A_{26}$ to $A_{31}$ and the output of the adder 81. In addition, the carry output from adder 81 is provided as the carry in to adder 63, while the carry output from adder 82 is input to conditional increment circuit 86. The output of adder 82 is provided to conditional increment circuit 86, the output of which is controlled by the carry output of adder 82. The outputs of conditional increment circuit 86 and adder 83 are supplied to modulo 63 adder 85, and the carry out from adder 83 is provided as the carry in to adder 85. Adder 85 produces the logical BSM number. Simple changes, such as adding adjacent digits rather than subtracting and performing modulo 63 arithmetic rather than modulo 65, allows the circuitry shown in FIG. 4 to perform BSM determination for the case of 63 BSMs. The improved post-add modulo 63 circuitry is simpler than that shown in FIG. 3A.

Figure 8:
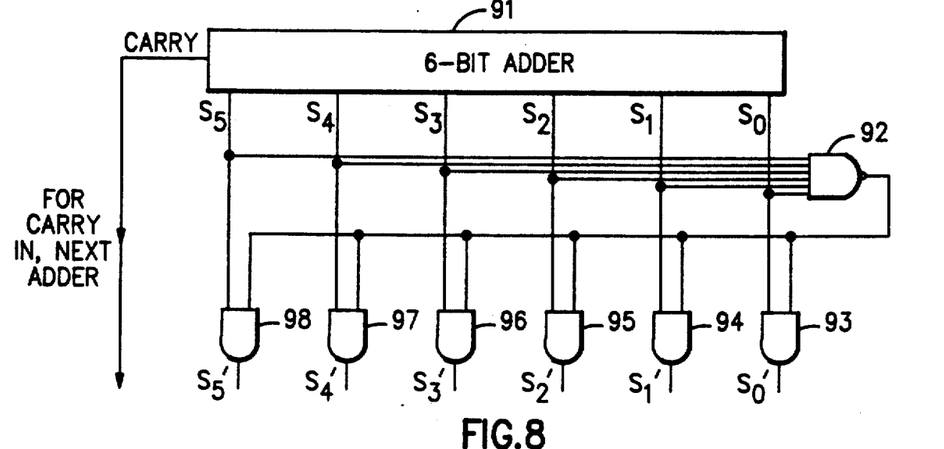
FIG. 8 is a detailed logic diagram showing improved "post-add" modulo 63 circuitry.

FIG. 8 shows a modulo 63 adder which comprises a 6-bit adder 91, so the carry out of the highest-order stage signals whether the sum is greater than 63. The sum bits are all input to a 6-input NAND gate 92 whose output is FALSE only when the sum of 63 appears. The output of the NAND gate 92 is ANDed individually with each of the sum bits $S_0$ through $S_5$ in respective AND gates 93 to 98; therefore, the sum bits pass through unchanged except when the sum equals 63, in which case the value of zero is sent to the next stage of the tree shown in FIG. 7. (Zero is the result of modulo 63 arithmetic on the value 63.) The other case in which the sum needs to be modified is when the sum is greater than 63. This is handled by not using the carry as part of the next adder's input (thereby effectively subtracting 64) but inputting the carry to the low-order carry of the next stage (and effectively adding one for a net change of minus 63) FIG. 7 shows how this technique is applied to adders 81 and 83, both of which are in the critical path. On the left hand side of the tree, the incrementer 86 adds the carry out value to the sum output from adder 82 since the final adder 85 cannot accept two low-order carry inputs. As before, the BSM number is subtracted from the address to create a value which is known to be a multiple of the number of logical BSMs (63 in this case).

Figure 9:
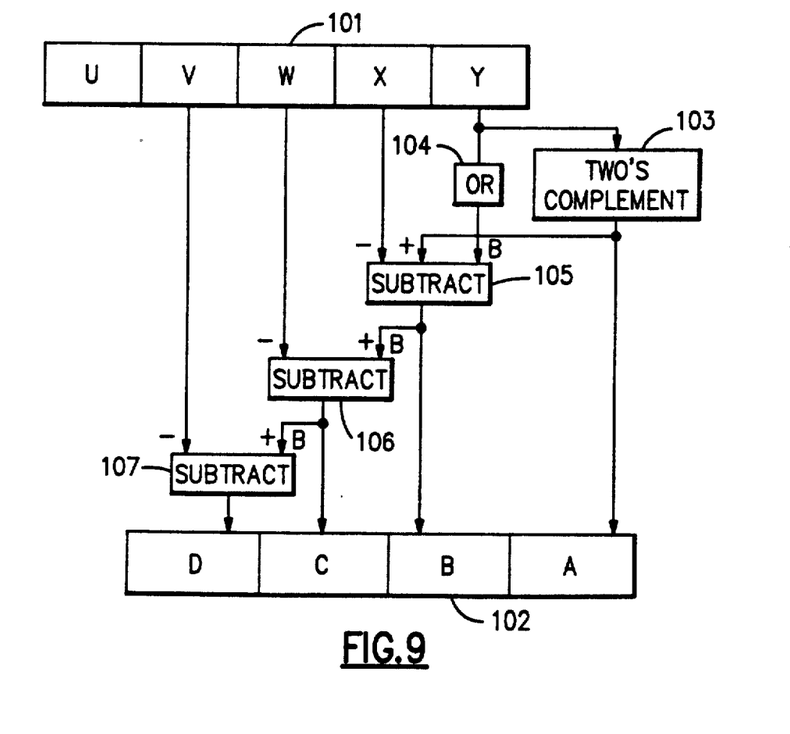
FIG. 9 is a detailed block diagram showing a circuit for calculating an address within a BSM when only 63 BSMs are active.

The scheme shown in FIG. 9 is similar to that shown in FIG. 5 in the case of 65 logical BSMs and could be used to determine the address within a bank from the value which is known to be a multiple of 63. As shown in FIG. 9, the 30-bit value, a multiple of 63, is partitioned in register 101 into five 6-bit fields, U, V, W, X, and Y, where U is the high-order field. The expected address within a BSM is partitioned in register 102 into four 6-bit fields, A, B, C, and D, where D is the high-order field. A two's complement is performed on the value Y in circuit 103 and input to A. In addition, the 6-bit field Y is ORed in OR gate 104 to generate a borrow B. The values X, W and V are each input as the subtrahend to respective subtractors 105, 106 and 107. The two's complement of the value Y from circuit 103 is provided as the minuend input to subtractor 105, and the borrow from OR gate 104 is also input to subtractor 105. The borrow output from subtractor 105 is input as the minuend input to subtractor 106, while the borrow output from subtractor 106 is input as the minuend input to subtractor 107. The outputs of subtractors 105, 106 and 107 are the values B, C and D, respectively.

Mapping of Logical BSMs to Physical BSMs

Figure 10:
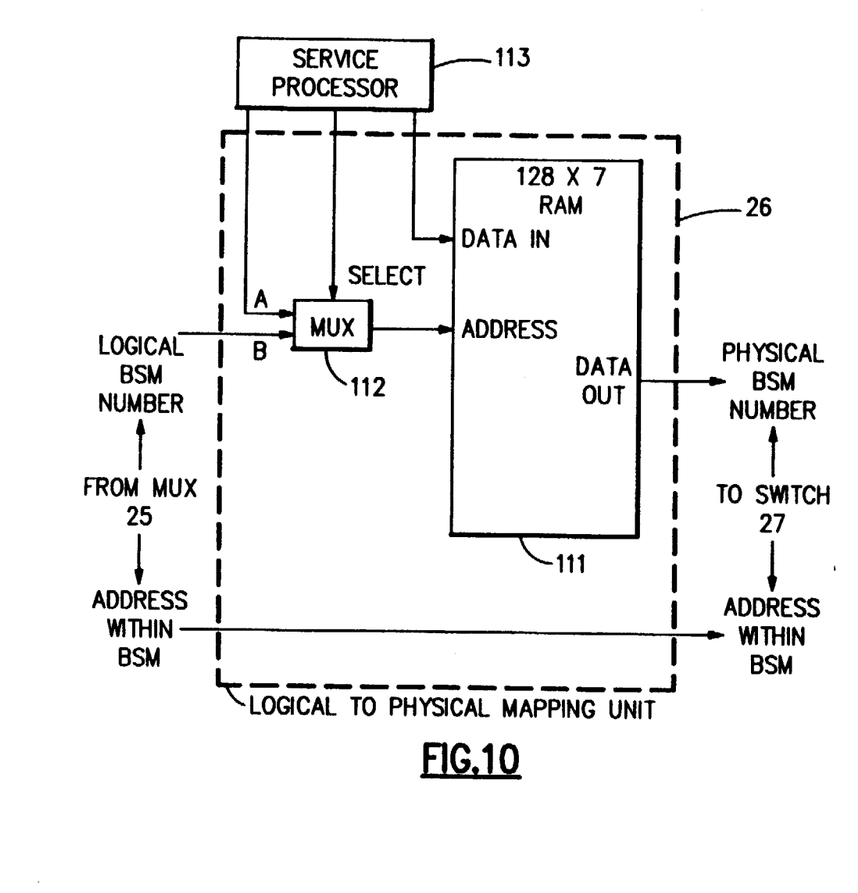
FIG. 10 is a detailed block diagram showing the logical to physical BSM mapping unit using a RAM table.
Figure 10A:
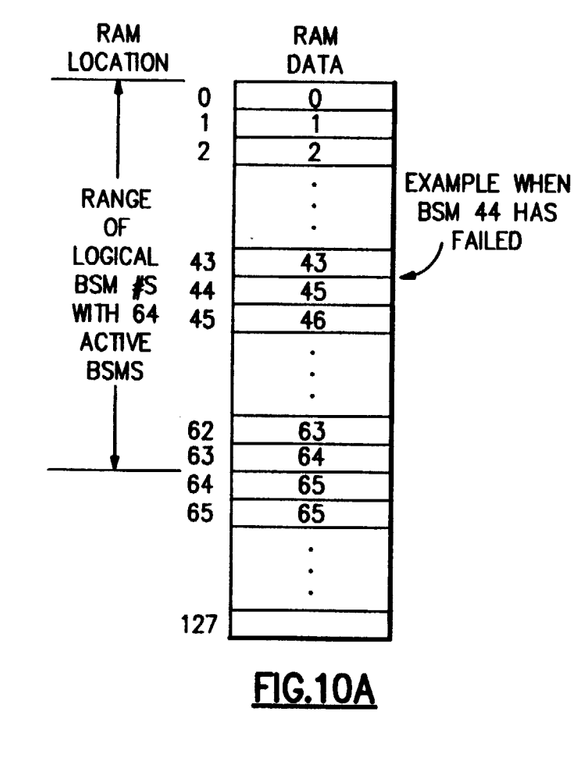
FIG. 10A is a memory map illustrating the example when BSM number 44 has failed.

Each of the three circuits 22, 23 and 24 shown in FIG. 2 operate continuously. The multiplexor 25 selects the appropriate result (a logical BSM address and an address within the BSM) based on the number of currently available BSMs. This selected BSM value ranges from 0 to one less than the active number of BSMs. To skip over any failed BSMs, a final (logical to physical) mapping of BSM numbers is required. Since this final one-to-one mapping is the same for all processors, it can be performed in parallel with switch arbitration. The mapping circuit 26 is implemented as a table look-up with a 65 by 7-bit RAM (random access memory) 111 as shown in FIG. 10. Under normal operating conditions, the B input to the multiplexor 112 is always selected and the contents of the RAM 111 are addressed using the logical BSM value from multiplexor 25 (FIG. 2), the data in that location corresponding to the physical BSM number. The data in the table is maintained by the service processor 113. The table in RAM 111 is updated as BSMs fail (made inactive) or fixed (made active) by selecting input A of the multiplexor 112, driving the address lines with values ranging from zero to 64, and placing the corresponding physical BSM number on the data input lines of RAM 111. FIG. 10A shows an example of the memory map of RAM 111 for the case where BSM number 44 has failed.

Figure 11:
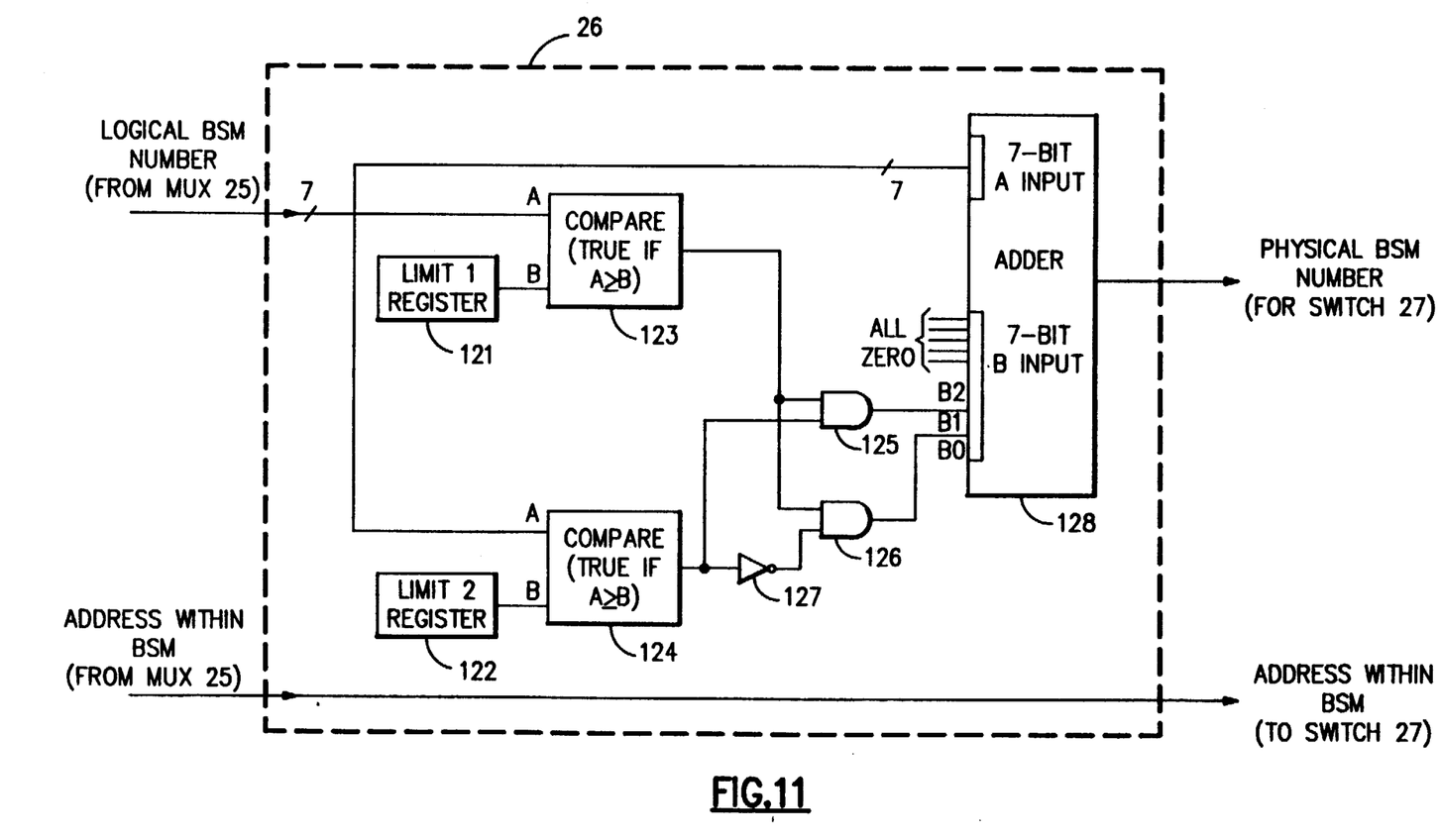
FIG. 11 is a detailed logic diagram showing the logical to physical BSM mapping unit using LIMIT registers.

An alternative approach shown in FIG. 11 uses two registers 121 and 122, storing values LIMIT1 and LIMIT2, respectively, which retain the physical BSM numbers of the failed memory unit(s). The fact that two limit registers are used corresponds to the fact that the memory subsystem is intended to function when up to two BSMs have failed. These registers are updated by the service processor 113 (FIG. 10) in the same manner as the RAM table 111. A value of 65 is placed in both limit registers 121 all 65 banks are active. The number of the failed BSMs would be placed in register 121 (LIMIT2=65) when one BSM failed. When there are two failed BSMs, the smaller BSM number is placed in register 121 and the larger one is placed in register 122.

By comparing the incoming BSM number (7 bits) to LIMIT1 and LIMIT2 in comparators 123 and 124 respectively, a determination is made as to whether to add 0, 1 or 2 to obtain the correct physical BSM value. If the logical BSM number is less than LIMIT1 (and thereby less than LIMIT2), the outputs of both comparators 123 and 124 will be FALSE. The output of comparator 123 is supplied as one input to each of AND gates 125 and 126. The output of comparator 124 is also supplied to one input of AND gate 125, but it is inverted by inverter 127 before being applied to AND gate 126. The outputs of AND gates 125 and 126 generate the bits $B_1$ and $B_0$, respectively; therefore, bits $B_0$ and $B_1$ will both be zero (B=0) when the outputs of both comparators 123 and 124 are FALSE, and the logical BSM number will be passed through 7-bit adder 128 unmodified to become the physical BSM number. If the logical BSM number is greater than or equal to LIMIT1 and less than LIMIT2, the output of comparator 123 will be TRUE while the output of comparator 124 will be FALSE. Therefore, bit $B_0=1$ and bit $B_1=0$. This results in adding one to the logical BSM number in adder 128 to produce the physical BSM number. In the case where the logical BSM number is greater than LIMIT2 (and thereby greater than LIMIT1), both comparators 123 and 124 have TRUE outputs. In this case, bit $B_1=1$ and bit $B_0=0$, corresponding to generating a physical BSM value which is two more than the logical value. Note that the address within the BSM is not affected.

BSM < LIMIT1 → add 0

LIMIT1 ≦ BSM < LIMIT2 → add 1

LIMIT2 ≦ BSM → add 2

It might be noted that adding two is the same as incrementing starting at the next to lowest-order bit. No modulo circuitry is needed at the adder output since the number of failed BSMs affects the maximum value of the logical BSM number (via multiplexor 25 in FIG. 2) in such a manner that the adder output always results in a physical BSM number in the range of zero to 64.

Special Cases

In an implementation which does not support the option of operation with $2^N-1$ BSMs, the hardware can be simplified. In this example, the circuitry associated with the calculations for 63 BSMs can be eliminated. An improvement to the logical to-physical BSM mapping circuit can take advantage of the fact that at most one BSM will be bad. In this case, no limit checking is required. A constant value is added to all BSM values. If all BSMs are functional, the constant could be zero. In the case of a failed BSM, its BSM number plus one will be the offset constant By allowing the values above 64 to wrap around (BSM65 becomes BSM0), 64 logical BSMs will be mapped to the 64 functioning BSMs.

SUMMARY

The disclosed invention has three main advantages. First, the invention provides for the gradual degradation of memory capacity. A failure of one BSM results in only that BSM being removed. This is far superior to systems in which a failing BSM would halve the available number of BSMs and memory capacity. The halving of BSMs greatly increases BSM contention and results in a noticeable performance degradation.

Second, effective sparing is achieved without the associated cost overhead. The 65th BSM incorporated into the design of the preferred embodiment is to be distinguished from the provision of a spare memory module since, in the invention, all of the functioning memory is available for use.

Third, the invention provides improved performance. Generally, the number of BSMs will be $2^N+1$. Since the stride values found in most applications are close to being relatively prime to $2^N+1$, the BSM contention from stride-N accessing is reduced. Aside from the stride-related performance advantage, the additional BSM decreases BSM contention by roughly 2% simply because the number of BSMs are increased.

While the invention has been described in terms of a single preferred embodiment, those skilled in the art will recognize that the invention can be practiced with modification within the spirit and scope of the appended claims. For example, since the invention maintains a contiguous space, the teaching of the invention could be applied hierarchically (or recursively); sparing could apply to a BSM and banks within the BSM.

APPENDIX

The following is a verification of the "Address within a BSM" circuit for 65 BSMs shown in FIG. 5.

The input to the circuit is the value (real address) minus (real address modulo 65). Therefore, the input to the circuit is known to be a multiple of 65 (65*N) and contains up to 30 bits. The value N, the address within a BSM, is desired. If 65*N can be represented in 30 bits, it is known that N can be represented in 24 bits. These 24 bits can be grouped into four sets of six bits each, labeled A, B, C, and D, as shown below. Furthermore, the value 65*N can be segmented into 6-bit fields labeled U, V, W, X, and Y.

```
Field:    5   4   3   2   1
         ┌───┬───┬───┬───┐
         │ D │ C │ B │ A │        N
         └───┴───┴───┴───┘
       ┌───┬───┬───┬───┐
    +  │ D │ C │ B │ A │         64*N
       └───┴───┴───┴───┘
     ┌───┬───┬───┬───┬───┐
     │ U │ V │ W │ X │ Y │       65*N
     └───┴───┴───┴───┴───┘
```

As can be seen, the value 65*N can be thought of as the sum of N and 64*N. Since the low-order six bits of 64*N are known to be zero, the value A must be equal to Y. Since B=X−A, then B=X−Y.

The subtraction of Y from X (to determine B) may have resulted in a borrow from field 3. The borrow need not be extended beyond W as the value of D can be determined independently. For field 3, it can be seen that C=W−B−(borrow from (Y−X)). Now we will examine how the value of D can be determined simply from the original values of U and V. Consider the following three cases for the relationship of the values of U and V.

Case 1. U<V

From field 5, D≦U; therefore, D<V. From field 4, if D<V, there can be no carry into field 5. Therefore, D=U.

Case 2. U=V

D must equal U. Form field 5, the only other choice would be that D=U−1 and there was a carry into field 5. But if D=U−1, then D+1=V, which means no carry into field 5. Therefore, D=U.

Case 3. U>V

Since D≧U−1, and U−1>V−1, then D>V−1. This leaves two choices:
D>V: From field 4, there will be a carry into field 5; therefore, D=U−1.
D=V: Since U>V, U>D. this requires a carry into field 5; therefore, D=U−1.
In summary, if U>V, then D=U−1; otherwise, D=U.

For modulo 63 (FIG. 9), the fields are arranged as follows:

```
Field:    5   4   3   2   1
         ┌───┬───┬───┬───┬───┐
         │ D │ C │ B │ A │ 0 │    64*N
         └───┴───┴───┴───┴───┘
       ┌───┬───┬───┬───┬───┐
    -  │ U │ V │ W │ X │ Y │     63*N
       └───┴───┴───┴───┴───┘
     ┌───┬───┬───┬───┬───┐
     │ 0 │ D │ C │ B │ A │        N
     └───┴───┴───┴───┴───┘
```

$A = \overline{Y}+1$ (two's complement of Y) for field 1. If $Y \neq 0$, then a borrow occurs from field 2. Therefore, $B = A - X - Borrow_2$, where $Borrow_2 = OR$ (Y); $C = B - W - Borrow_3$, where $Borrow_3$ is the borrow out of the "B=" computation; and $D = C - V - Borrow_4$.

Having thus described our invention, what we claim as new and desire to secure by Letters Patent is as follows:

1. A highly interleaved memory system comprising: a plurality of central processing units selectively connected by a switching network to $2^n+1$, $2^n$, or $2^n-1$ memory modules where n is a positive integer, said central processing units including means for generating two address components for a logical address of one of said memory modules, one address component selecting a memory module and another address component specifying an address within a selected memory module, said means for generating said two address components including means for dividing a system logical address by the currently selected number of modules to specify said address within a memory module and means for taking a modulo of the currently selected number of modules to determine the selected memory module, an efficient sparing mechanism for said memory system wherein zero, one or two of the memory modules may be specified as disabled or failed while all others of said plurality of memory modules are accessible by said plurality of central processing units, said sparing mechanism comprising:
    means responsive to a real address of one of said plurality of memory modules for generating a module select number and module address for a logically-contiguous dynamically-specified number of enabled memory modules; and
    means for mapping a logically contiguous set of enabled memory modules is a set of physical modules in which zero, one or two of the memory modules may be specified as disabled or failed.

2. The sparing mechanism as recited in claim 1 wherein the number of memory modules is $2^N+1$.

3. The sparing mechanism recited in claim 2 wherein the number of memory modules is 65 of which 65, 64 or 63 of said memory modules may be enabled.

4. The sparing mechanism recited in claim 1 wherein said means for generating a module select number and module address comprises:
   three translation means for continuously translating said logical address into a module select number and module address using modulo arithmetic for a maximum number of said plurality of memory modules, said maximum number less one and said maximum number less two, respectively; and
   multiplexor means responsive to a dynamically-specified number of enabled memory modules for selecting an output from one of said translation means.

5. The sparing mechanism as recited in claim 4 wherein the number of memory modules is $2^N+1$.

6. The sparing mechanism recited in claim 5 wherein the number of memory modules is 65 of which 65, 64 or 63 of said memory modules may be enabled.

7. The sparing mechanism recited in claim 6 wherein said three translation means perform modulo 65, modulo 64 and modulo 63 arithmetic, respectively, to generate a module select number and module address.

8. The sparing mechanism recited in claim 1 wherein said means for mapping comprises RAM table means responsive to said module select number for generating a physical memory module number.

9. The sparing mechanism recited in claim 1 wherein said means for mapping comprises:
   first and second limit register means for storing first and second values;
   first and second comparator means each having as a first input said module select number and as a second input a respective one of said first and second limit register means for determining whether to add an offset value which may be zero, one or two to said module select number to generate a physical memory module number; and
   adder means responsive to said first and second comparator means for adding zero, one and two to said module select number.

10. The sparing mechanism recited in claim 1 wherein said means for generating a module select number and module address comprises translation means and said translation means comprises:
   parallel adder means for generating a first sum comprising a plurality of bits from a high order bit to a low order bit; and
   post-add means for resetting said high order bit and performing a decrement of all remaining bits if said sum is greater than a modulo base number.

* * * * *